MAGNETIC CONTROL FOR SCALE OF TWO DEVICES

Original Filed Aug. 25, 1953

INVENTOR
GORDON E. WHITNEY
BY

JOHN ALDEN HALL
ATTORNEY

United States Patent Office

Re. 24,358
Reissued Sept. 17, 1957

24,358

MAGNETIC CONTROL FOR SCALE OF TWO DEVICES

Gordon Earle Whitney, Princeton, N. J., assignor to International Business Machines Corporation, New York, N. Y., a corporation of New York Original No. 2,710,928, dated June 14, 1955, Serial No. 376,491, August 25, 1953. Application for reissue April 10, 1957, Serial No. 652,076

21 Claims. (Cl. 307—88)

Matter enclosed in heavy brackets [ ] appears in the original patent but forms no part of this reissue specification; matter printed in italics indicates the additions made by reissue.

This invention relates to electromagnetic means for controlling extensive circuit networks and particularly to counters adapted for use in binary logical circuits.

The binary system as a means for expressing information has been employed conventionally in the computer art since the simple two conditions of a device operated or not operated may be used to record or register information in coded form. The mechanical movement of relays has been employed for these purposes in what may now be termed slow speed systems while the establishment of circuits through electron streams in various types of electron tubes has been used in the higher speed systems. The trend in development has been toward higher speed operation, smaller and more economical units, reduction of power requirements, elimination of dissipated heat and primarily a total absence of mechanical movement.

The object of the present invention is to provide a static device of small dimensions which is stable in two states to either one of which it may be driven with a minimum of effort within an extraordinarily short time interval and which requires no power to be held in either state to which it has been driven.

In accordance with the present invention, magnetic material having a substantially rectangular hysteresis loop is used as the core of a coil. When the core is energized the magnetomotive force produced drives the core to saturation and when the energization of the core is relaxed the field strength of the magnetic material remains practically unchanged. If the field is positive it may be changed to a negative field only by a reverse magnetomotive force sufficient to reach and exceed the knee of the curve. Any reverse magnetomotive force insufficient to reach this point will have no practical effect on the point of remanence for one the relaxation of the reversed magnetomotive force the field strength will remain practically at the value established on saturation.

Thus, magnetic material of this nature has two stable states, and since the change from one to the other may be detected and employed a coil magnetically interlinked with such a core may be used as a binary element.

A feature of the invention is a core of bistable magnetic material having several coils interlinked therewith including two coils in series and oppositely poled for driving the core successively and alternately to its two stable states. It has been found that two such coils designed to produce in the core equal and opposite magnetomotive effects, deviate from this effect so that that coil which produces the force to drive the coil from the established to the opposite state overcomes the other and starts a change in state. This has been found to be true in both directions so that a change in state may be induced by a transient energization of two such serially related coils. This is believed to be due to the comparative effective impedance of the two coils due to the state of the core with which they are magnetically interlinked.

Another feature of the invention is the use of regenerative means responsive to a change in state of the said magnetic core for amplifying the effect and to thus speed the operation. It will be realized that with a substantially rectangular hysteresis loop the change in state is extremely rapid when the applied magnetomotive force is sufficient to drive the element to the knee of the curve. By the use of regenerative means the magnetomotive force may be fortified with the result that the knee of the curve is more rapidly reached and passed. By way of example, with presently available materials, triggering pulses of as short a time duration as one quarter of a microsecond are sufficient for certain operation.

Another feature of the invention is the use of a pair of semiconductor amplifiers as regenerative means, one for producing the regenerative effect in one direction and another for producing the regenerative effect in the other direction. For the proper operation of such semiconductor amplifiers, each is associated with two additional coils magnetically interlinked with the said core. These two coils are poled in the same direction so that when current controlled by the said amplifier flows through both in series their effects will be added. Elements of the semiconductor amplifier are placed in circuit between the said two coils in a manner whereby the potential levels along this series connection will so affect the said amplifier that it will induce a greater current flow. Thus, if any current flow is induced in this circuit by some outside agency such current flow will trigger a regenerative effect by the said amplifier.

Other features will appear hereinafter.

The drawings consist of one sheet having five figures as follows.

A scale of two device is one which gives one output signal for every two input signals. Such devices are known in telecommunication systems as W–Z relay combinations (Clark 1,438,743 and Cesareo 1,751,263). In the form where the input and output signals are transient currents such devices find use in calculating and accounting machines where binary logical operations are employed.

The present device is based on the use of a magnetic element which is stable in two states, one in which it is positively energized and the other in which it is negatively energized. In one state it may be said to express binary 0 while in the other it may be said to express binary 1.

Figure 1:
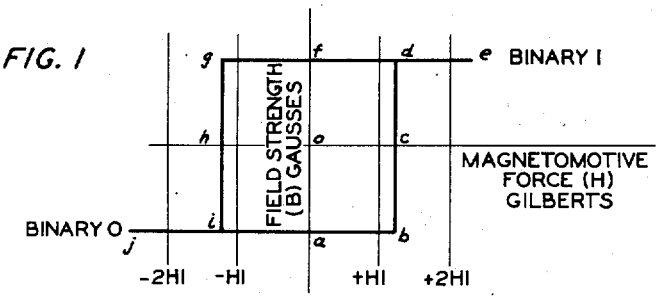
Fig. 1 is an idealized hysteresis loop of the magnetic material used as a core in the device of the present invention.

Such a device is constructed by interconnecting the magnetic circuits of a number of coils with a magnetic element having high retentivity and exhibiting a substantially square hysteresis curve, as illustrated in Fig. 1. Assuming that the magnetic element or core is at the point of remanence a, and that a magnetomotive force in the order of $2H_1$ is applied thereto, then the strength of the field will be reversed and the curve a b c d e will be traced. When the magnetomotive force is relaxed the curve e d f will be traced and the point of remanence f will be reached and retained. If thereafter any positive magnetomotive force either less than $+H_1$ or more than $+2H_1$ is applied no change in state will be produced and on relaxation of this force the core will return to the point f. If a negative magnetomotive force of something greater than $-H_1$ but insufficient to drive the element to point g is applied no change will be produced and again on relaxation of this force the element will return to point f. If, however, a force approaching $-2H_1$ or greater is applied, then a change in state will be produced and the curve f g h i j will be produced with a retreat to the point a upon relaxation. When the magnetic element or core is at the point of remanence a it may be said to express binary 0, whereas if it is at the point f it may be said to express binary 1.

Figure 2:
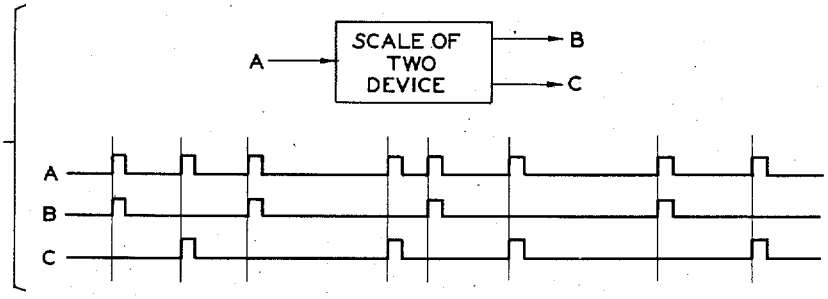
Fig. 2 is a schematic representation of a scale of two device showing the relation of the pulses over the input and the pulses over two output channels.

By the use of such an element a scale of two device may be constructed and arranged as indicated in Fig. 2. Here a scale of two device is indicated as having a single input A and a pair of outputs B and C, either one or both of which may be usefully employed. Below this schematic representation there are shown three graphs marked A, B and C respectively to represent current pulses in the input A and the two outputs B and C. The input pulses may be irregularly spaced as shown or they may be regularly spaced, in accordance with the use to which the device is put. Upon the 1st, 3rd, 5th and 7th input pulses, corresponding pulses will be produced in the output B and upon the 2nd, 4th, 6th and 8th input pulses, corresponding pulses will be produced in the output C.

Figure 3:
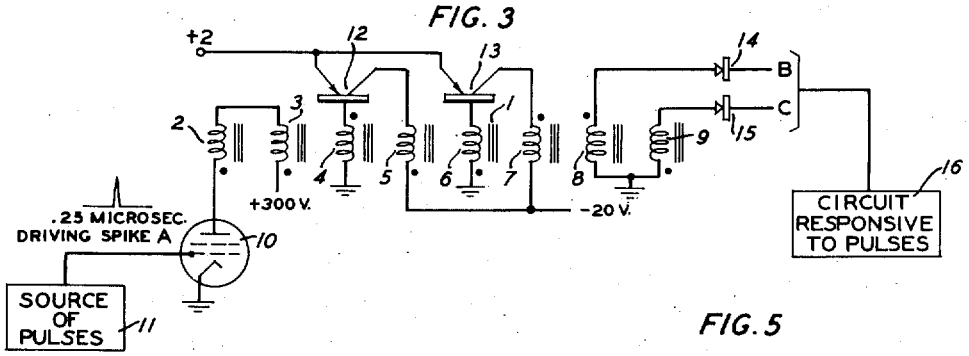
Fig. 3 is a schematic circuit diagram showing the connections of the coils of the magnetic element and the two semiconductor amplifiers employed for the present purposes.
Figure 4:
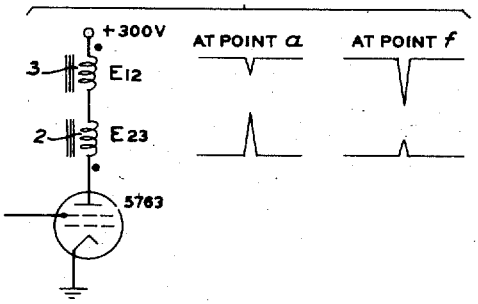
Fig. 4 is a fragmentary circuit diagram showing a part of the circuit of Fig. 3 and used to explain the operation thereof.

The scale of two device may be constructed as indicated in Fig. 3. Therein a core 1 is interlinked with eight coils 2 to 9 inclusive. Each coil has a dot placed at one end thereof to indicate the polarity of the coil. Thus it will be noted that coils 2 and 3 connected in series between tube 10 and a positive potential are connected to oppose each other. A source of pulses 11 connected to the grid of the tube 10 acts to activate the tube 10 transiently and thus transmit a pulse through the windings 2 and 3. If the core is at the point a, then a pulse in this circuit will produce the result depicted in Fig. 4, that is, the coil 3 will exhibit a weak negative potential whereas the coil 2 will exhibit a strong positive potential. If, on the other hand, the core is at the point of remanence f, these results will be reversed and the negative potential of the coil 3 will be strong enough to overcome the weak positive potential of coil 2. It is to be particularly noted that even though these coils 2 and 3 are alike in every respect they do not produce equal and opposite fields which cancel out to zero. Applicant believes that the explanation for this phenomenon lies in the fact that in the first instance the coil 3 is endeavoring to magnetize the core in the direction in which it is already magnetized and that no amount of magnetomotive force applied will increase that state. Applicant believes that the tiny negative pulse depicted in Fig. 4 is the result of the fact that the hysteresis curve is not in fact the idealized version of Fig. 1 and that in fact a small negative increase in the strength of the field is produced. Since the field set up by the coil 3 therefore produces no marked result, the coil acts as a short and very little voltage is induced. On the other hand coil 2 produces a positive magnetizing force tending to change the strength of the field from a over the curve a b c d e so that the coil 2 acts as a high impedance load and a large voltage is induced. Put in another way, the effective impedance of the coil 3 is greater than the effective impedance of the coil 2 due to the state of the core and therefore the coil 2 dissipates a greater power.

Be this explanation scientifically correct or not, it is true that when the core is at point a the coil 2 has a predominant effect and then the core is at point f, the coil 3 is predominant.

In the circuit arrangement of Fig. 3 it will be noted that two semiconductor amplifiers 12 and 13 are included. In each the base is connected through a coil to ground and the collector is connected through another coil to source of negative potential. However, the base and collector coils of the two transistors are poled oppositely.

If it is assumed that the magnetic core is at the remanence point a, then an incoming pulse from the tube 10 through the predominant action of coil 2 will have the effect on coil 6 of rendering the base of the transistor 13 positive, so that the emitter to the base becomes negative and eliminates any current flow from the emitter to the collector as holes are only emitted into the substance (germanium) when emitter to base voltage is positive. Hence, this transistor 13 remains cut off. The base of the other transistor 12, however, will go negative, making the bias emitter to base positive and causing holes to be emitted into the germanium. Some of the holes will pass to the collector as the whisker is not a rectifier of holes and there will be conventional current flow from emitter to collector. This collector current will induce a voltage in winding 5, causing the polarity thereof to go negative. The resulting volts per turn of this coil will appear at the base as a negative voltage causing positive feedback. This action will continue until the core is changed from binary 0 to binary 1, whereupon, there being no further change in flux, the induced voltages will be zero and the transistor will return to its static state.

Since the circuit is symmetrical, the same sequence of events will take place when the next triggering pulse is applied except that this time the transition will be from binary 1 to binary 0 and transistor 13 instead of transistor 12 will be the one in action.

There are also shown two additional coils 8 and 9 in series with diodes 14 and 15 respectively to act as output circuits. Either one or both of these windings may be used to supply the output pulses to a circuit responsive to such pulses such as the device 16. By way of example, the C circuit from coil 9 may be used as the source of pulses for another scale of two device like Fig. 3, thus building up a counter.

Figure 5:
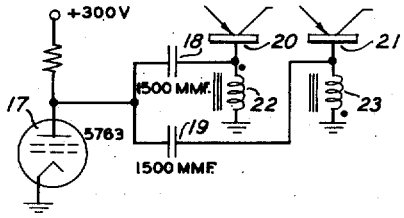
Fig. 5 is a fragmentary circuit diagram showing an alternative means for triggering the device.

Fig. 5 shows an alternative triggering method which operates very satisfactorily in practice. Here instead of using two oppositely poled coils in series the plate of the tube 17 feeds into two small capacity condensers 18 and 19 and that transistor 20 or 21 which is connected to the coil 22 or 23 respectively which will develop the greatest negative potential will take control and will operate in a manner similar to that above described.

What is claimed is:

1. An electromagnetic binary device having a core of magnetic material characterized by two equal and opposite stable remanence states interlinked with the magnetic circuits of two equal and oppositely wound coils, a series circuit including said coils, means for transmitting a transient current therethrough, said coils producing equal and opposite magnetic effects responsive to direct current flow therethrough but unequal and opposite magnetic effects responsive to transient current flow therethrough.

2. An electromagnetic binary device having a core of magnetic material characterized by a markedly rectangular hysteresis loop, interlinked with the magnetic circuits of two equal and oppositely wound coils, a series circuit including said coils, means for transmitting a transient current therethrough, said coils producing unequal and opposite magnetic effects responsive to transmission of a transient current therethrough.

3. The combination of a core of bistable magnetic material, triggering means for starting a change of state of said magnetic material comprising a pair of equal and oppositely wound coils having their magnetic circuits interlinked with said core, a series circuit including said coils, means for transmitting a transient current therethrough for unequally energizing said coils, and a pair of oppositely acting regenerative means each responsive to a change in state of said core in one direction for fortifying said change of state.

4. The combination of a core of bistable magnetic material, triggering means for starting a change of state of said magnetic material comprising a pair of equal and oppositely wound coils having their magnetic circuits interlinked with said core, a series circuit including said coils, means for transmitting a transient current therethrough for unequally energizing said coils, regenerative means for fortifying a change of state started by said triggering means, said regenerative means comprising a pair of coils wound to produce magnetomotive forces of like direction and having their magnetic circuits interlinked with said core and a semiconductor amplifier connected in circuit therewith.

5. The combination of a core of bistable magnetic material, triggering means for starting a change of state of said magnetic material comprising a pair of equal and oppositely wound coils having their magnetic circuits interlinked with said core, a series circuit including said coils, means for transmitting a transient current therethrough for unequally energizing said coils, regenerative means for fortifying a change of state started by said triggering means, said regenerative means comprising a pair of semiconductor amplifiers poled in opposite directions each provided with a circuit arrangement including a pair of coils wound to produce magnetomotive forces of like direction and having their magnetic circuits interlinked with said core, said circuit arrangements each including a said semiconductor amplifier and said two coils being serially arranged to produce potential levels in said amplifier to produce an increasingly stronger operation thereof.

6. The combination of a core of bistable magnetic material, triggering means for starting a change of state of said magnetic material comprising a pair of equal and oppositely wound coils having their magnetic circuits interlinked with said core, a series circuit including said coils, means for transmitting a transient current therethrough for unequally energizing said coils, regenerative means for causing a change of state of said core comprising a pair of coils wound to produce magnetomotive forces of like direction and having their magnetic circuits interlinked with said core and a semiconductor amplifier connected in circuit therewith, said triggering coils and said regenerative circuit coils being magnetically interlinked for transformer operation by said core and being so poled that a transient trigger pulse in said triggering coils will induce a regenerative current flow in said regenerative circuit coils.

7. An electromagnetic binary device having a bistable core of magnetic material, a coil wound about said core, a semiconductor amplifier connected in series with said coil for amplifying current flow in said coil and triggering means for enabling said amplifier, said trigger means consisting of an input circuit responsive to incoming pulses and a circuit including a small capacity condenser connected between said input circuit and the junction between said coil and said amplifier.

8. An electromagnetic binary device having a core of magnetic material characterized by two equal and opposite stable remanence states interlinked with the magnetic circuits of two equal and oppositely wound coils, a single circuit including said coils, and means for simultaneously transmitting a transient current therethrough, said coils being unequally responsive to said transient current to change its said state of remanence.

*9. A binary trigger circuit comprising a memory device having a saturable magnetic core, a pair of saturating windings on said core, a pair of saturating means, each including one of said windings, both saturating means being operable in response to input signals of limited duration and of only one predetermined polarity to initiate a variation of the magnetic flux in the core in respectively opposite senses and to continue that variation to saturation, each of said saturating means including limiting means effective to prevent operation of its associated saturating means when the core is saturated in its direction, means to deliver input signals of said limited duration and predetermined polarity simultaneously to both said saturating means, so that successive input signals are effective to saturate the core alternately in opposite directions, and signal output means responsive to variation of the flux in the core in one sense only.*

*10. A binary trigger circuit as defined in claim 9, in which said signal output means comprises another winding on said core.*

*11. A binary trigger circuit comprising a memory device including a saturable magnetic core, means for saturating said core with magnetic flux in selectively opposite directions, including two driving windings on said core, two feedback windings on said core, two amplifying means, each including an output circuit and an input circuit, each of said output circuits including one of said driving windings, each of said input circuits including one of said feedback windings, the driving and feedback windings for each amplifying means being connected to provide positive feedback, the feedback windings for the respective amplifying means being connected to provide feedback signals of opposite polarities upon a change in magnetic flux in said core in a given sense, the driving windings being connected to vary the magnetic flux in the core in opposite senses in response to input signals of a predetermined polarity, and means for supplying input signal pulses of limited duration and of said polarity simultaneously to both input circuits, so that successive input signals are effective to saturate the core alternately in opposite directions, and signal output means responsive to variation of the flux in the core in one sense only.*

*12. A binary trigger circuit as defined in claim 11, in which each said amplifying means comprises a transistor operable selectively in "on" and "off" conditions.*

*13. A binary trigger circuit comprising amplifier means, means to transmit input signal pulses of limited duration to said amplifier means, a memory device shiftable between two distinct memory conditions and stable in either of said conditions without the expenditure of energy, means including said amplifier means effective upon successive input signal pulses to shift said memory device alternately from one condition to the other and back again, and signal output means operated by said memory device to produce an output signal only when said device shifts from a particular one of said conditions to the other.*

*14. A binary trigger circuit comprising transistor means, means to transmit input signal pulses of limited duration to said transistor means, a memory device shiftable between two distinct memory conditions and stable in either of said conditions without the expenditure of energy, means including said transistor means effective upon successive input signal pulses to shift said memory device alternately from one condition to the other and back again, and signal output means operated by said memory device to produce an output signal only when said device shifts from one of said conditions to the other.*

*15. A binary trigger circuit as defined in claim 14, wherein said memory device comprises a saturable magnetic core and said two conditions comprise saturation of the core with magnetic fields of opposite polarities.*

*16. A binary trigger circuit as defined in claim 15, wherein said signal output means includes an output winding on said core, and means connected in series with said winding and effective to block output signals of one polarity.*

*17. A magnetic memory device including a saturable magnetic core, means for saturating the said core with magnetic flux including a driving winding on said core and a feedback winding on said core, amplifying means including an output circuit and an input circuit, means*

*normally effective to cut off substantially the flow of current in said output circuit, means connecting said driving winding electrically in said output circuit, means connecting said feedback winding electrically in both said input and output circuits, said feedback winding being arranged both magnetically and electrically, to provide positive feedback, means independent of said feedback winding for supplying an input pulse of limited duration to said input circuit, said driving and feedback windings being effective in response to such an input signal to produce in said driving winding a current continuing until the core becomes saturated.*

*18. A magnetic memory device, including a saturable magnetic core, means for saturating said core with magnetic flux in selectively opposite directions, including two driving windings on said core, two feedback windings on said core, two amplifying means, each including an output circuit and an input circuit, means normally effective to cut off substantially the flow of current in both said output circuits, each of said output circuits including one of said driving windings, each of said input circuits including one of said feedback windings, the driving and feedback windings for each amplifying device being connected to provide positive feedback, the feedback windings for the respective amplifying means being connected to provide feedback signals of opposite polarities upon a change in magnetic flux in said core in a given sense, the driving windings being connected to vary the magnetic flux in the core in opposite senses in response to input*

*signals of a predetermined polarity, and means external to said feedback windings for supplying input signals of limited duration simultaneously to said input circuits, each said signal being effective to turn on only one of said amplifying means, depending upon the previous condition of saturation of the core, and each said amplifying means being effective when turned on to saturate the core in the sense opposite to said previous condition.*

*19. A magnetic memory device as defined in claim 18, in which said feedback winding is connected electrically in both said output and input circuits, and is arranged both magnetically and electrically for positive feedback.*

*20. A magnetic memory device as defined in claim 18, including an output winding on said core separate from said driving and feedback windings.*

*21. A magnetic memory device as defined in claim 20, including means connected in series with said output winding to block signal pulses of one polarity.*

References Cited in the file of this patent or the original patent

UNITED STATES PATENTS

| | | |
|---|---|---|
| 2,430,457 | Dimond | Nov. 11, 1947 |
| 2,574,438 | Rossi et al. | Nov. 6, 1951 |
| 2,591,406 | Carter et al. | Apr. 1, 1952 |
| 2,652,501 | Wilson | Sept. 15, 1953 |
| 2,654,080 | Browne, Jr. | Sept. 29, 1953 |